(12) United States Patent
Wilcox

(10) Patent No.: US 9,455,677 B2
(45) Date of Patent: Sep. 27, 2016

(54) WIRELESS AUDIO CONTROL APPARATUS

(71) Applicant: INCYNC LLC, Grass Valley, CA (US)

(72) Inventor: Clinton "Bud" Wilcox, Grass Valley, CA (US)

(73) Assignee: SDI Technologies, Inc., Rahway, NJ (US)

( * ) Notice: Subject to any disclaimer, the term of this patent is extended or adjusted under 35 U.S.C. 154(b) by 238 days.

(21) Appl. No.: 14/151,761

(22) Filed: Jan. 9, 2014

(65) Prior Publication Data

US 2014/0192996 A1 Jul. 10, 2014

Related U.S. Application Data

(60) Provisional application No. 61/751,013, filed on Jan. 10, 2013.

(51) Int. Cl.
*H04R 5/02* (2006.01)
*H03G 1/02* (2006.01)
*H04R 5/033* (2006.01)
*H04R 1/10* (2006.01)
*H04R 27/00* (2006.01)
*H04M 1/05* (2006.01)
*H04M 1/60* (2006.01)

(52) U.S. Cl.
CPC ................. *H03G 1/02* (2013.01); *H04M 1/05* (2013.01); *H04R 1/105* (2013.01); *H04R 1/1041* (2013.01); *H04R 1/1058* (2013.01); *H04R 5/0335* (2013.01); *H04R 27/00* (2013.01); *H04M 1/6066* (2013.01); *H04R 2201/023* (2013.01); *H04R 2201/107* (2013.01); *H04R 2420/07* (2013.01); *H04R 2430/01* (2013.01); *H04R 2499/11* (2013.01)

(58) Field of Classification Search
CPC H04R 1/1016; H04R 1/1066; H04R 1/1075; H04R 5/033; H04R 5/0335; H04R 2201/023; H04R 2201/107; H04R 2420/07; H04R 2430/01; H04R 2499/11; H04M 1/05
USPC ...... 381/301, 309, 71.6, 370, 374, 375, 376, 381/381; 2/209, 209.13; 455/344, 351, 455/575.2; 181/128, 129
See application file for complete search history.

(56) References Cited

U.S. PATENT DOCUMENTS

| | | | | |
|---|---|---|---|---|
| 5,438,698 A | * | 8/1995 | Burton | H01Q 1/276 2/209.13 |
| 5,881,160 A | * | 3/1999 | Sheppard | H04R 5/023 381/374 |
| 6,301,367 B1 | * | 10/2001 | Boyden | A42B 1/245 2/209 |
| 7,426,464 B2 | | 9/2008 | Hui et al. | |
| 7,647,077 B2 | | 1/2010 | Hui et al. | |
| 2012/0027227 A1 | | 2/2012 | Kok et al. | |

* cited by examiner

*Primary Examiner* — Huyen D Le
(74) *Attorney, Agent, or Firm* — Temmerman Law Office; Matthew J. Temmerman

(57) ABSTRACT

A wireless audio control apparatus comprises a U-shaped outer shell having an outer surface, an inner surface and a plurality of side surfaces. A spring clip is attached to the inner surface of the outer shell. A speaker, a microphone and at least one control interface are located on the outer surface of the outer shell. A jack sealed behind a jack cover is located on at least one of the plurality of side surfaces of the outer shell. A wireless transceiver, an amplifier and a rechargeable battery are located inside the outer shell. The wireless audio control apparatus is configured to control the audio output from a wirelessly attached personal audio device while being removably affixed to a generally planar object worn by a user.

15 Claims, 7 Drawing Sheets

WIRELESS AUDIO CONTROL APPARATUS

RELATED APPLICATIONS

This application claims priority from the U.S. provisional application with Ser. No. 61/751,013 filed on Jan. 10, 2013. The disclosure of the provisional application is incorporated herein as if set out in full.

BACKGROUND OF THE DISCLOSURE

1. Technical Field of the Disclosure

The present disclosure is related in general to audio and communication devices, and in particular to a clip-on wireless audio control apparatus for listening to audio or making phone calls from a personal audio device.

2. Description of the Related Art

There has recently been an increase in the use of personal audio devices (a broad class that includes electronic devices such as MP3 players, iPads, iPods, and most modern smart phones, including among others iPhones and Android phones) in all aspects of day-to-day life. Many enjoy using their audio devices to listen to music, talk shows or other audio while working, driving, playing sports, exercising, walking, relaxing, riding their bicycles, etc. One common approach is to use headphones or ear-buds. Many users, however, dislike headphones and/or ear-buds. Further, many cyclists also wear helmets both for safety and in some cases to comply with relevant local laws. These helmets often present an obstacle for cyclists who wish to listen to music or other audio while riding, because normal headphones will not fit over them, and most headphones will not fit inside of them. Furthermore, many users dislike the cords associated with headphones, and ear-buds.

Many people also enjoy talking on a mobile phone while working, driving, playing sports, exercising, walking, relaxing, riding their bicycle, etc. This is typically done through simply holding the phone with one hand while continuing with the current activity. This approach suffers from the clear drawback of requiring the full time use of one of the user's hands. Some people elect to use a set of mobile phone compatible headphone or ear-buds, equipped with an in-line microphone. Many users, however, dislike headphones and ear-buds, and many users also dislike the cords often associated headphones and ear-buds. Another solution is the use of a wireless option, such as a Bluetooth headset wherein the user communicates through the mobile phone using an earpiece generally comprising both a speaker and a microphone. One drawback to this system is that it still requires the user to insert or otherwise affix the headset to their ear, and many users dislike and/or find this uncomfortable. Another solution is the installation of permanent speaker and microphone systems, such as hands free speakerphone systems in cars, houses, bikes, etc. This solution suffers the drawback of requiring the user to purchase and install separate speaker and microphone systems for each activity or location.

A specific drawback that occurs with regard to bicycle helmets is that due to the close fit of the bicycle helmet to the cyclist's head, there is often little extra room to fit a wireless earpiece. Further, existing earpieces are not designed to pick up audio spoken by the user when the user is wearing a helmet, thus making it difficult for the microphone to accurately and clearly reproduce any words spoken. Finally, in some jurisdictions, it is against the law for a cyclist to wear an earpiece, and thus this solution in those jurisdictions is not possible.

Currently there are several systems that work within or on bicycle helmets to allow cyclists to listen to audio feeds while riding. However, these systems come with distinct drawbacks. The sound systems are generally internal to the helmets, requiring speakers to be placed in the ear spaces of the helmet, or worse as ear-buds into the ears of the cyclist. The latter solution is sometimes illegal and dangerous if the ear-buds dislodge and distract the cyclist. The cyclist will then have to unplug either the source connector (leaving a wire extending from the helmet) or the connector to the helmet speaker (leaving a wire extending from the source). The system of placing wired speakers in the helmet is generally disadvantageous because the ear spaces in the helmet are tight-fitting, and any large speaker placed in that space may be uncomfortable to the helmet wearer. Furthermore, manufacturers do not typically provide such systems and thus it is often a do-it-yourself project rigged up by the purchaser of the helmet.

Recent advancements in the art provide a sports helmet including a liner comprised of impact resistant material and a protective shell encasing an outer surface of the liner. A female audio jack is secured within a rear cavity of the liner and has an aperture for receiving a male audio jack connected to a portable audio device. A pair of cavities is formed on opposite sides of the liner in which are secured speakers. Wiring extends from the female audio jack to the integral speakers. The speakers are positioned and oriented such so as to provide audio to the helmet wearer without blocking surrounding sound, and without affecting the safety aspects of the helmet. However, wiring extends from the female audio jack to the integral speakers as well as from the helmet to the portable audio device which may interfere with the user's movements.

One of the existing wireless audio control apparatus includes a wireless personal audio equipment arrangement comprising a hat, a control circuit including a microwave link receiver carried by the hat, the control circuit outputting signals to speakers, and acoustic chambers conducting sound signals produced by the speakers to earpieces carried by the hat. Another existing wireless audio control apparatus provides a device for housing an electronic device and which is removably secured to a hat. The device includes a front portion and two arm portions, with the electronic device preferably secured to the front portion and a speaker member disposed near the end of each arm portion. Speaker wires running from the speakers to the electronic device can be hidden by disposed the wires within the arm portions. As the device is removable it can be easily and quickly detached from a first hat for use with another hat. However, the speakers in such systems are either placed proximate to or in physical contact with the ears of the wearer. This can be irritating and lead to discomfort over time especially during motion of the wearer as during riding of a bicycle, etc.

Another existing wireless audio control apparatus provides a hat with sound playing function comprising a hat body, a brim extending from the hat body and at least one slim speaker. The brim has a supporting layer and a decorating layer covering a surface of the supporting layer. The at least one slim speaker is disposed between the supporting layer and the decorating layer. Still another existing wireless audio control apparatus provides a baseball-style cap and stereo combination having a crown, a brim/bill, a sweatband, and two amplified stereo speakers concealed within the brim/bill. The stereo components including a circuit board, an amplifier and battery are concealed within an inner surface and/or inner space defined as the area between the lowermost inner surface area of the crown and the inner surface of the sweatband when pulled apart from one another. Also included are wires connecting the battery to the circuit board and wires connecting the amplifier to the speakers both of which are concealed within the sweatband. A stereophonic music generator sends a music signal which is provided to the amplifier by any suitable means of communication, like an audio cord or wireless by means of infrared or Bluetooth wireless technology. However, such systems are integral with the hats or helmets and cannot be removed for attachment with another hat or helmet.

Various other wireless audio control apparatuses exist that employ a wireless communication device utilizing a Bluetooth technology for use on a helmet or hat. Some systems include a communications system configured to attach to a helmet that includes vent openings formed in an outer shell of the helmet. Components of the system are configured to extend through the openings of the helmet for detachably coupling the components to the helmet. The system can include a main communications module that includes electronic components and a control panel. The system can also include other audio components such as speakers and a microphone. Some other systems include a helmet with a cavity within that allows a Bluetooth transceiver to be easily removable and easily upgradable without changing the external host controller. This apparatus is capable of communicating with a cell phone, communicating with a second helmet, communicating with an audio device, communicating with a global positioning system, and communicating with two or more Bluetooth transceivers all within one unit. Some systems include a wireless receiver positioned on the helmet, which receives the digitized audio signal from a wireless transmitter coupled with the portable computing device. Speaker ear cones are positioned on the helmet near the user's ears without the speaker ear cones contacting the user's ears, the speaker ear cones connected with the processor for creating an audible audio signal from the analog audio signal. However, all such systems are suitable for attachment to helmets only and cannot be affixed to a variety of generally planar objects, including but not limited to cap brims, back pack straps, and sun visors.

Based on the foregoing, there is a demonstrable need for a wireless audio control apparatus that would allow a user to use their mobile phone and/or to enjoy their personal audio device without holding the phone/device in one hand, and without the use of headphones, ear-buds, or a headset while still delivering crisp, clear sound in a safe and effective way. Such a needed apparatus would receive a clear audio signal for the user, which does not require the use of a cord, and which may be easily moved from one location to another. The wireless audio control apparatus would be temporarily placed externally on a generally planar object, and would provide superior comfort and sound quality. The apparatus would allow the user to have a mobile telephone discussion, and be easily attachable to a variety of generally planar objects, including but not limited to cap brims, back pack straps, and sun visors. The present invention overcomes prior art shortcomings by accomplishing these critical objectives.

SUMMARY OF THE DISCLOSURE

To minimize the limitations found in the prior art and to minimize other limitations that will be apparent upon the reading of the specifications, the preferred embodiment of the present invention provides a wireless audio control apparatus that may be easily, securely, and removably affixed to a variety of generally planar objects, including but not limited to cap brims, back pack straps, and sun visors.

The present invention discloses a wireless audio control apparatus for listening to audio or making phone calls from a personal audio device designed to removably attach to any generally planar object. Controls are present on the apparatus to allow the user to control the audio output from the apparatus, as well as to control a wirelessly attached personal audio device (e.g. MP3 players, iPads, iPods, and most modern smart phones). The apparatus comprises wireless communication means to receive and transmit audio to and from the personal audio device.

According to certain embodiments of the present invention, the wireless audio control apparatus comprises a U-shaped outer shell having an outer surface, an inner surface and a plurality of side surfaces. The wireless audio control apparatus further comprises a spring clip attached to the inner surface of the outer shell. The outer shell is designed to attach to a generally planar object (e.g. a cap brim) while the spring clip holds the apparatus securely to the object. The apparatus may be clipped to any appropriate object including but not limited to hats, sun visors, backpack straps, clothing, clip boards, etc. The apparatus is configured to control the audio output from a wirelessly attached personal audio device while being removably affixed to the generally planar object worn by or used by an individual.

In accordance with an aspect of the present invention, the wireless audio control apparatus further comprises a speaker located on the outer surface of the outer shell, a microphone located on the outer surface of the outer shell, at least one control interface located on the outer surface of the outer shell, and a wireless transceiver located inside the outer shell. The wireless transceiver supports a variety of Bluetooth protocols including A2DP (Advanced Audio Distribution Protocol), AVRCP (Audio/Video Remote Control Protocol), and HFP/HSP (Hands Free Protocol/Head Set Protocol).

In accordance with another aspect of the present invention, the wireless audio control apparatus further comprises an amplifier located inside the outer shell. The amplifier increases or decreases the amount of power supplied to the speaker. A jack is located on at least one of the plurality of side surfaces of the outer shell and a rechargeable battery is located inside the outer shell. The jack is sealed by a jack cover when not in use and provides a charging port for charging the rechargeable battery via a USB (Universal Serial Bus) cable. The jack also provides an audio port to transmit audio via a stereo audio cable to an external audio system.

In accordance with yet another aspect of the present invention, the wireless transceiver may receive audio from an external, wirelessly transmitting, personal audio device and then play that audio through the speaker. The wireless transceiver may connect via Bluetooth to a mobile phone and transmit sound from the mobile phone to the speaker for the user to listen to while the microphone picks up sounds made by the user. The wireless transceiver in turn transmits the user's sounds to the mobile phone. The wireless transceiver controls the personal audio device via the at least one control interface. The at least one control interface performs various functions including turning on and turning off the apparatus, pairing with the personal audio device, answering and terminating a phone call, pausing and resuming an audio track, increasing and decreasing the volume level and advancing to a next/previous audio track.

A first objective of the present invention is to provide a wireless audio control apparatus that easily, securely, and removably attach to a variety of generally planar objects.

A second objective of the present invention is to provide a wireless audio control apparatus that allows a user to enjoy his or her personal audio device and/or to use their mobile phone without holding the phone/device in one hand.

A third objective of the present invention is to provide a wireless audio control apparatus that allows a user to enjoy his or her personal audio device and/or to use their mobile phone without the use of headphones, ear-buds, or a headset while still delivering crisp, clear sound in a safe and effective way.

A further objective of the present invention is to provide a wireless audio control apparatus in which the speaker is not directly covering the user's ears allowing ambient noise such as traffic and speech to be heard.

A further objective of the present invention is to provide a wireless audio control apparatus which is lightweight so as to not be intrusive to the user.

A final objective of the present invention is to provide a wireless audio control apparatus that is water resistant.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

Figure 1:
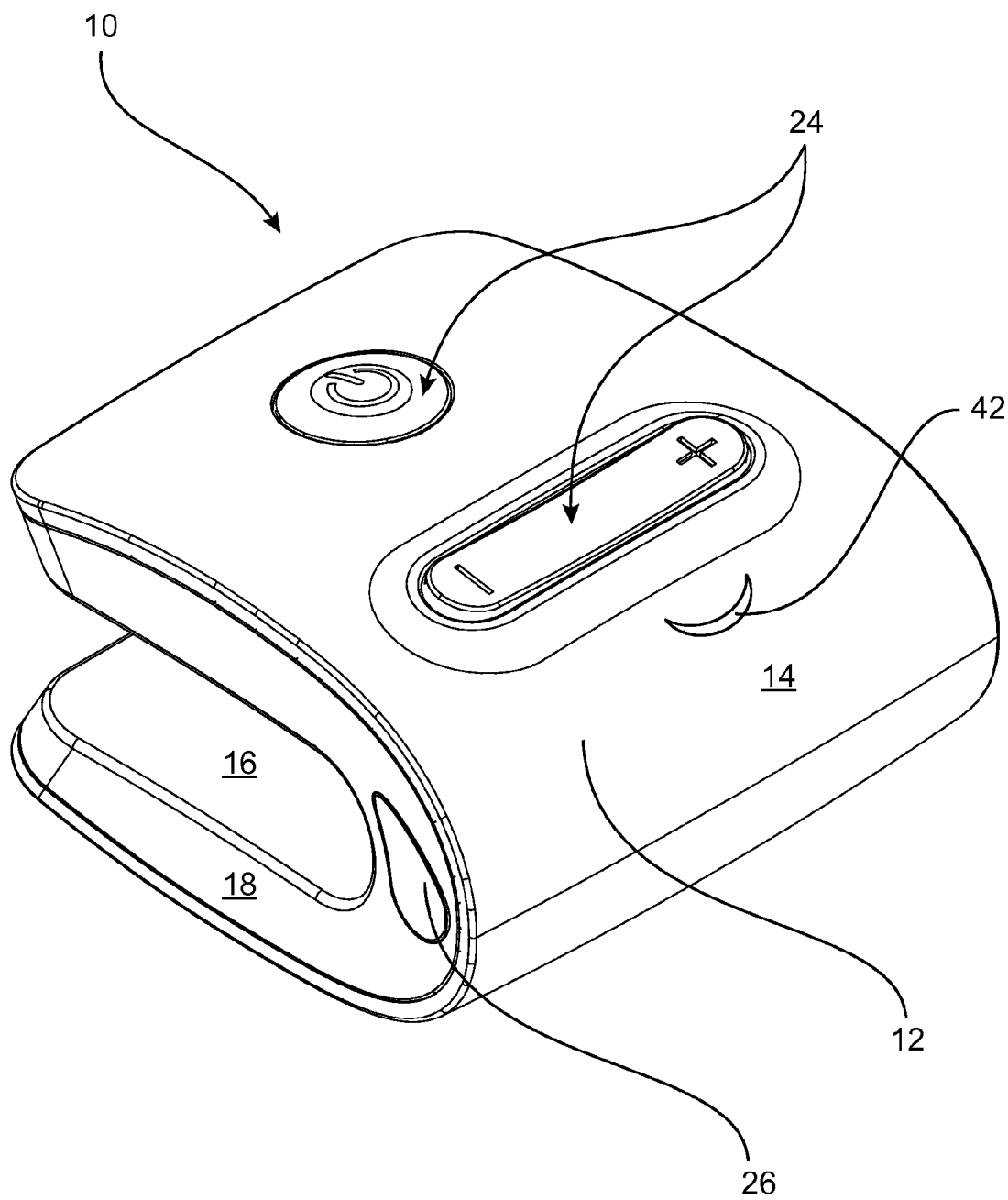
FIG. 1 is a top perspective view of a preferred embodiment of a wireless audio control apparatus.

Referring to FIG. 1, a top perspective view of a preferred embodiment of a wireless audio control apparatus 10 is illustrated. The wireless audio control apparatus 10 comprises a preferably U-shaped outer shell 12 having an outer surface 14, an inner surface 16 and a plurality of side surfaces 18. The outer shell 12 is configured to easily, securely, and removably attach to a variety of generally planar objects. In the preferred embodiment, the wireless audio control apparatus 10 further comprises a speaker 20 (See FIG. 2) located on the outer surface 14 of the outer shell 12, a microphone 22 located on the outer surface 14 of the outer shell 12, a wireless transceiver (not shown) located inside the outer shell 12 and at least one control interface 24 located on the outer surface 14 of the outer shell 12. The wireless audio control apparatus 10 is configured to control the audio output from a wirelessly attached personal audio device while being removably affixed to a generally planar object worn by a user.

Figure 2:
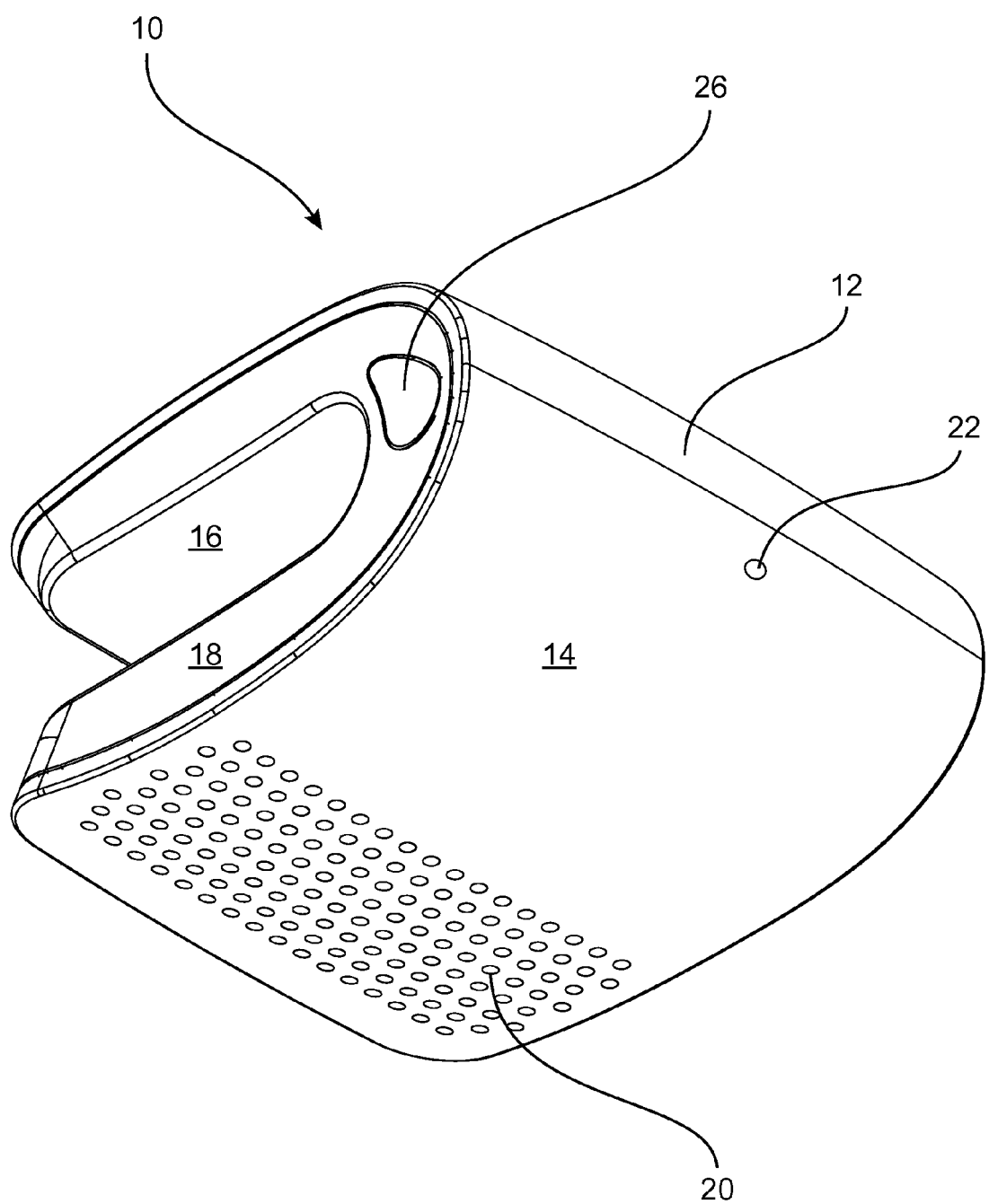
FIG. 2 is a bottom perspective view of the preferred embodiment of the wireless audio control apparatus.

FIG. 2 is a bottom perspective view of the preferred embodiment of the wireless audio control apparatus 10. The wireless audio control apparatus 10 further comprises an amplifier (not shown) located inside the outer shell 12, a jack 44 (See FIG. 6) located behind a jack cover 26 on at least one of the plurality of side surfaces 18 of the outer shell 12 and a rechargeable battery (not shown) located inside the outer shell 12. In some embodiments, various components listed here separately may be combined into a single unit. For example, in some embodiments the amplifier and the wireless transceiver may be combined into a single integrated circuit. In all embodiments the speaker 20, the microphone 22, the amplifier (not shown), the wireless transceiver (not shown), the rechargeable battery (not shown), the jack 44 (See FIG. 6), and the at least one control interface 24 are operably connected to each other. The wireless audio control apparatus 10 is rated IP66 (Ingress Protection Rating), and hence is water resistant. The entire apparatus 10 is a sealed unit, with the exception of the jack 44 (See FIG. 6), which is sealed by the jack cover 26 when not in use.

The amplifier (not shown), the wireless transceiver (not shown), and the at least one control interface 24 may be implemented by any means known in the art. In the preferred embodiment the amplifier (not shown), the wireless transceiver (not shown), and the at least one control interface 24 all reside on or are in communication with an integrated circuit. In the preferred embodiment the integrated circuit is in communication with the speaker 20, the microphone 22, the rechargeable battery (not shown), and the at least one control interface 24 and preferably includes the amplifier (not shown) to increase or decrease the amount of power supplied to the speaker 20. The integrated circuit may comprise additional amplification and filtering elements to amplify and filter the audio signal from the microphone 22 before it is transmitted via the wireless transceiver (not shown) to a personal audio device.

The wireless transceiver (not shown) supports a variety of Bluetooth protocols including 2DP (Advanced Audio Distribution Protocol), AVRCP (Audio/Video Remote Control Protocol), and HFP/HSP (Hands Free Protocol/Head Set Protocol). Table I illustrates the details regarding the above mentioned Bluetooth protocols. The A2DP protocol allows for the apparatus 10 to receive an audio signal from a personal audio device. The AVRCP protocol allows a user to control their personal audio device via the at least one control interface 24 of the apparatus 10. The HFP/HSP protocol allows the apparatus 10 to be used with a cell phone to make and receive phone calls, that is to say it allows for the apparatus 10 to both receive and send audio signals. This feature allows the apparatus 10 to communicate directly via Bluetooth with a mobile phone device such as an iPhone by Apple Inc. or a Droid smartphone. This feature of the apparatus 10 may be used in conjunction with the at least one control interface 24 as well as the microphone 22.

TABLE I

| Bluetooth | |
| --- | --- |
| Bluetooth Class | V2.1 + EDR CLASS II |
| Frequency Band | 2.4 GHz ISM Band |
| Range | 10 Meters |
| Protocols Supported | A2DP (Stereo Audio) |
| | HFP (Hands Free Protocol) |
| | HSP (Head Set Protocol) |
| | AVRCP (Remote Control) |

By use of the wireless transceiver (not shown), the wireless audio control apparatus 10 may receive audio signal from an external, wirelessly transmitting, personal audio device and then play the audio signal through the speaker 20. The personal audio device from which the wirelessly transmitted audio is received may be any suitable device, such as an MP3 player with wireless capabilities, an iPod touch, an iPhone, and a Droid mobile telephone with wireless capabilities. In another optional embodiment the personal audio device does not have wireless capabilities internally, but instead is connected to an accessory that contains the wireless capabilities within it, such as a dongle. While preferably the Bluetooth wireless protocol is used, it is to be understood that nearly any wireless system may be employed. Preferably, all Bluetooth-enabled mobile phones and smart phones that support protocols A2DP, HFP, HSP, and AVRCP (required for full support) may be supported by the apparatus 10.

The wireless audio control apparatus 10 may connect via Bluetooth to a mobile phone and transmit sound from the mobile phone to the speaker 20 for the user to listen to while the microphone 22 picks up sounds made by the user. The apparatus 10 in turn transmits the user's sounds to the mobile phone. Essentially, the apparatus 10 operates as would any conventional Bluetooth system enabling a user to have a phone conversation wirelessly. While numerous suitable microphones may be employed, a 4 mm Omni-directional microphone is preferred, having a sensitivity of −37 dB +/−3 dB (1 KHz, 0 dB=1 V/Pa), and preferably utilizing sound processing techniques such as but not limited to noise suppression, wind noise cancelation, echo cancellation, and automatic gain control. In another alternative embodiment, the wireless audio control apparatus 10 not only controls the speaker 20 embedded therein, but also controls at least one other speaker located separate and apart from the wireless audio control apparatus. For instance, in one embodiment (not shown) a separate speaker is controlled by the apparatus simultaneously to speaker 20 so that the user can experience stereo sound from the two speakers.

Figure 3:
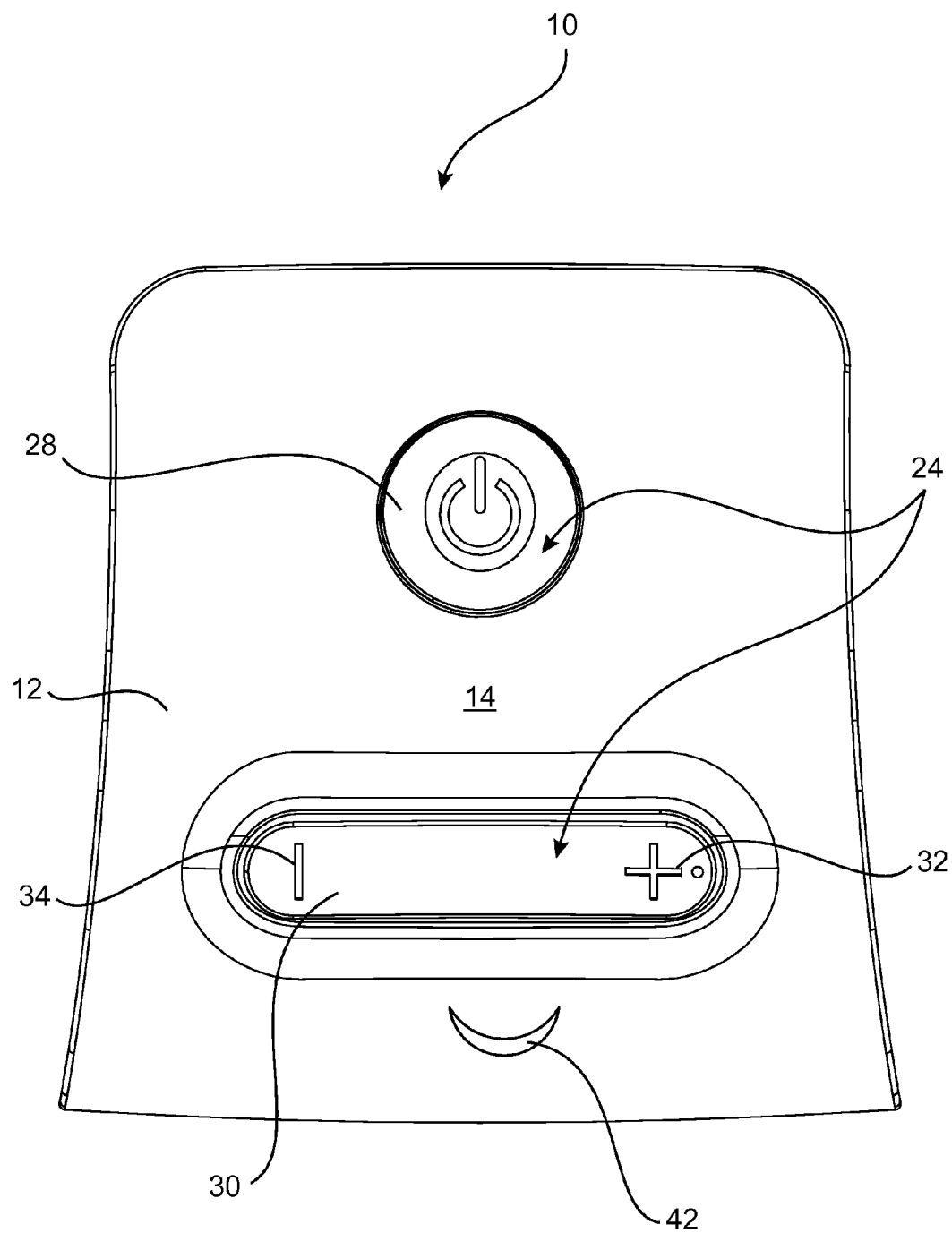
FIG. 3 is a top view of the preferred embodiment of the wireless audio control apparatus.
Figure 4:
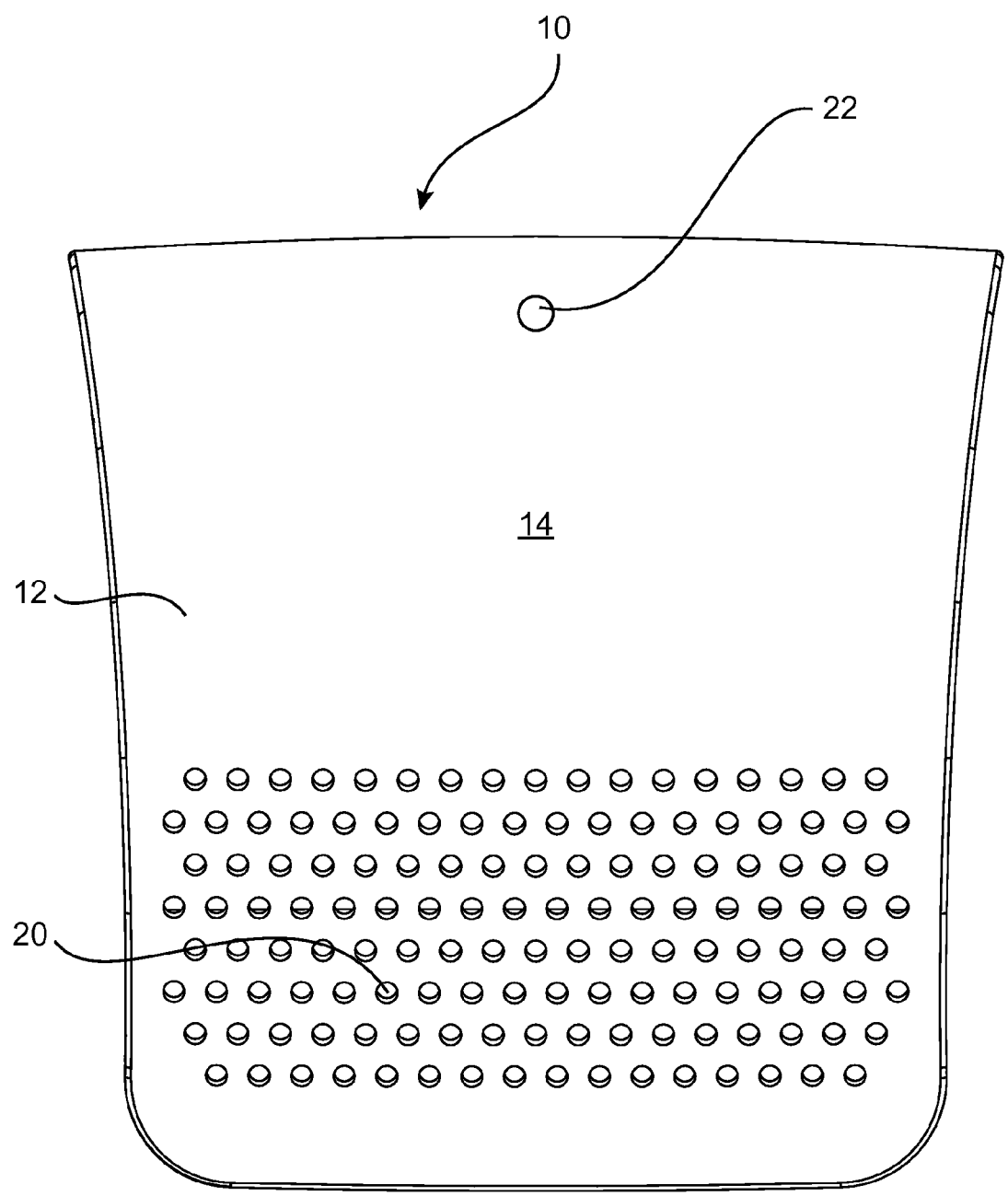
FIG. 4 is a bottom view of the preferred embodiment of the wireless audio control apparatus.

Turning to FIGS. 3 and 4, top and bottom views of the preferred embodiment of the wireless audio control apparatus 10 are illustrated respectively. Although control of the various functions of the apparatus 10 may be directed using any input device currently known, in the preferred embodiment the at least one control interface 24 comprises a multi-function button 28 and a rocker (dual) button 30. The multi-function button 28 is configured such that if the apparatus 10 is on, pressing the multi-function button 28 turns the apparatus 10 off when held. If the apparatus 10 is off the multi-function button 28 turns the apparatus 10 on, and if held after that allows the apparatus 10 to enter Bluetooth pairing mode. The multi-function button 28 if touched during an incoming phone call to a paired mobile phone device will answer the phone call, and the multi-function button 28 terminates the phone call if one is present. If listening to audio through an audio playback device, the multi-function button 28 pauses the audio, and if pressed again resumes the audio.

The rocker (dual) button 30 is configured such that pressing a first end 32 of the rocker button 30 increases the volume level and a second end 34 pressed decreases the volume level. If held, the first end 32 of the rocker button 30 advances to the next audio track of a paired audio playback device, and the second end 34 of the rocker button 30 plays the previous track of a paired audio playback device. It is to be understood that the controls in this exemplary embodiment could be positioned in various other places, further combined into few buttons, or expanded so control is input via additional buttons.

Exemplary controls from one embodiment of the invention are presented below in Table II.

TABLE II

| Controls | |
| --- | --- |
| When Using Bluetooth (Wireless) | Pair |
| | Power On/Off |
| | Volume Up/Down |
| Music Controls | Play |
| | Pause |
| | Next Track |
| | Previous Track |
| Phone Call Controls | Answer/End Call |
| | Cancel Outgoing Call |
| | Reject Incoming Call |
| | Mute/Unmute Mic During Call |

The wireless audio control apparatus 10 may further comprise a voice command button (not shown). The voice command button (not shown), if present, is configured to activate the voice command function of a paired personal audio device such that the user may send voice commands via the microphone 22 of the apparatus 10 to the paired personal audio device (e.g. "call mom"). In addition to the controls presented in Table II, a software application for mobile device may allow a related smartphone or tablet computer to control the audio and telephone functions of the apparatus 10. For instance, the smartphone may contain up and down arrows for volume control and large left and right arrows for changing tracks.

The wireless audio control apparatus 10 may further comprise at least one indicator 42, either visually based, sound based or both, on the outer surface 14 of the outer shell 12. The visual based indicators may be based on light, and preferably light generated from an LED. Using one or more lights as is known in the art, messages such as Power On, Power Off, Bluetooth Pairing, Low Battery Power, Charging, and Fully Charged may be expressed. Audible Indicators output from the speaker 20 may include notifications for Power On, Power Off, Pairing successful, Connection to Source Device successful, Connection to Source Device terminated, Max Volume Reached, Switch Call, Mute Call, and Low Battery Power.

Figure 5:
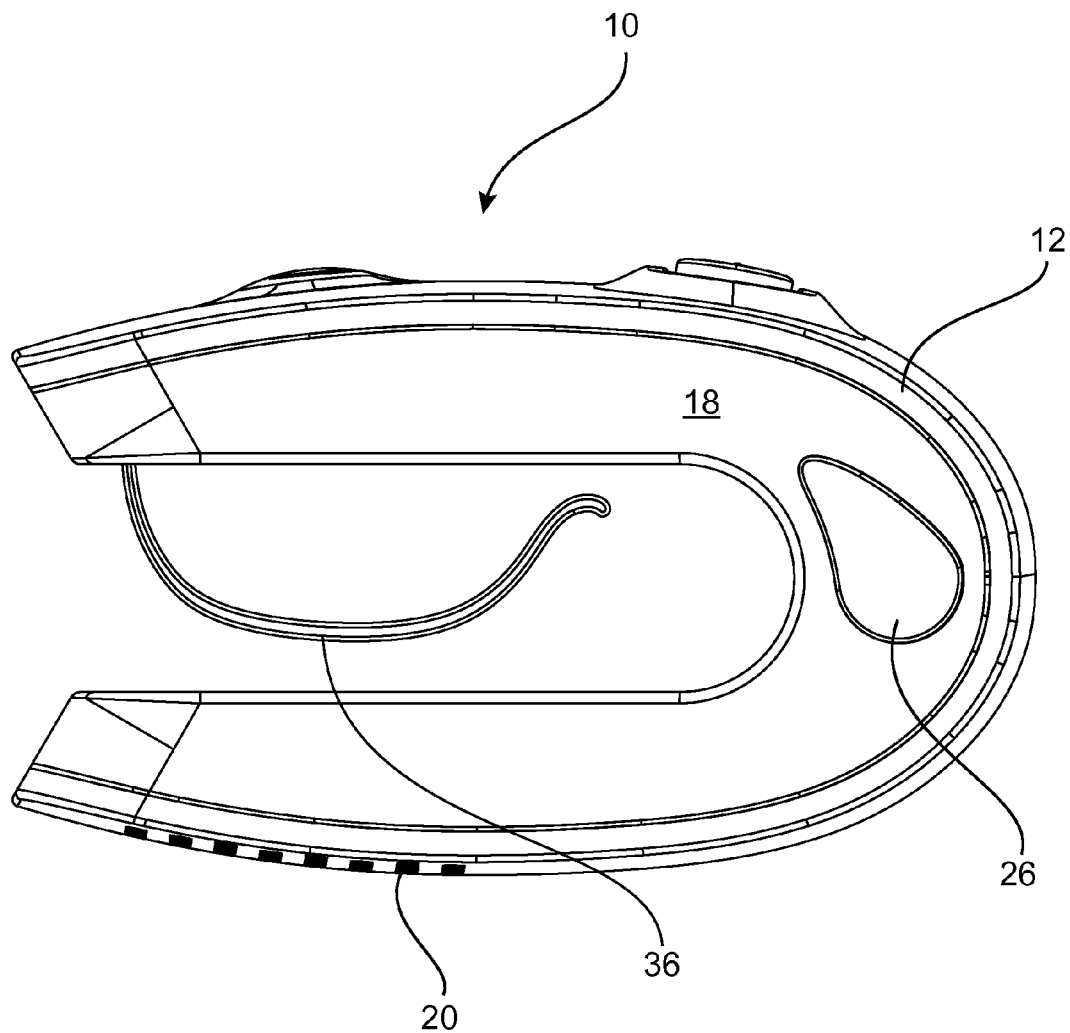
FIG. 5 is a side view of the preferred embodiment of the wireless audio control apparatus.

FIG. 5 is a side view of the preferred embodiment of the wireless audio control apparatus 10. In the preferred embodiment, the wireless audio control apparatus 10 further comprises a spring clip 36 for attachment to a variety of generally planar objects. The spring clip 36 holds the apparatus securely to the generally planar object that may be selected from a group comprising of: hats, caps, backpack straps, sun visors, clothing and clip boards.

Figure 6:
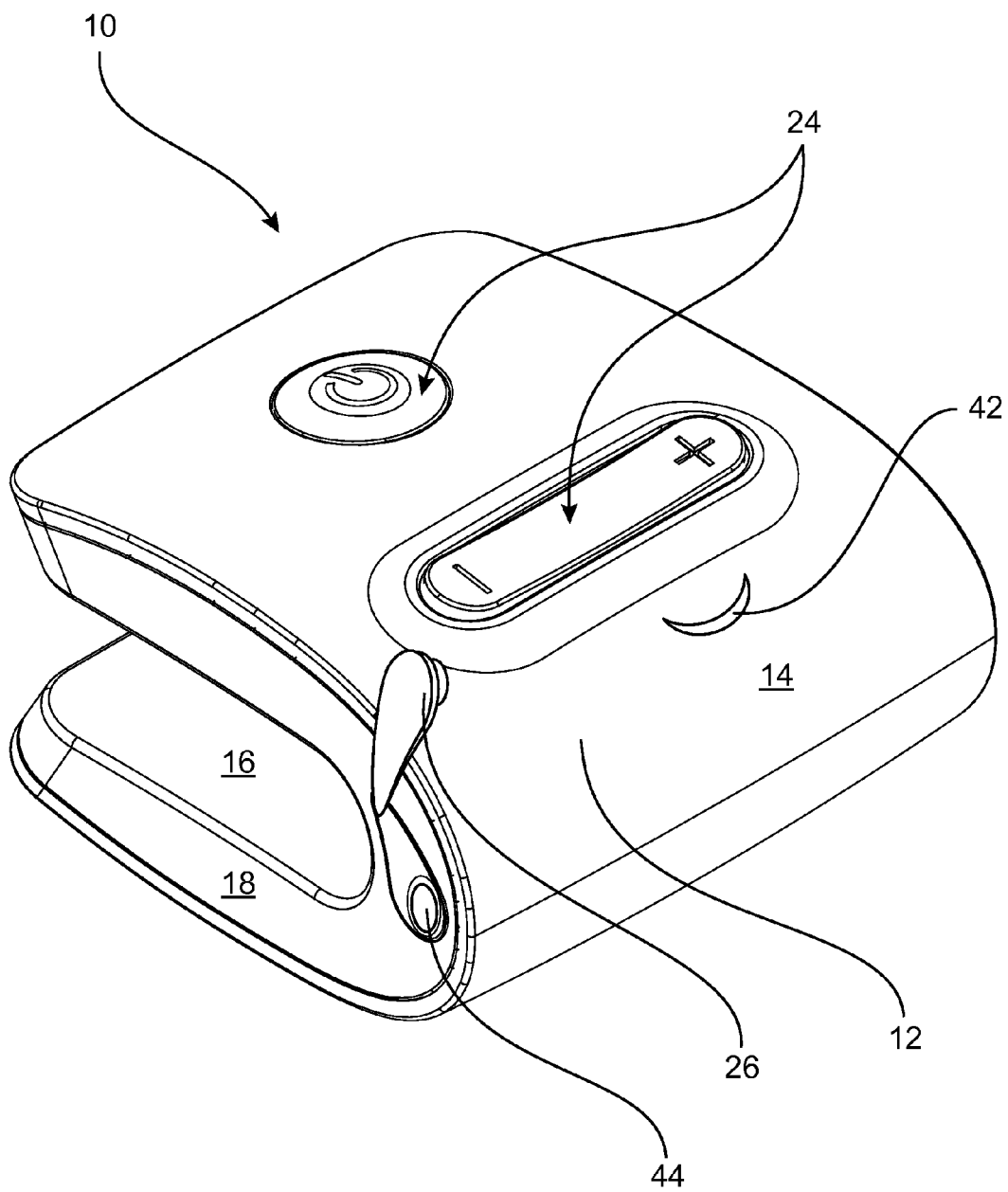
FIG. 6 is a top perspective view of the preferred embodiment of the wireless audio control apparatus showing an unsealed jack.

FIG. 6 is a top perspective view of the preferred embodiment of the wireless audio control apparatus 10 showing an unsealed jack 44. The wireless audio control apparatus 10 comprises a 3.5 mm jack 44, located beneath the jack cover 26. The jack 44 has multiple functions. The jack 44 is used to charge the rechargeable battery (not shown) of the apparatus 10, via a standard USB to 3.5 mm cable. The jack 44 also allows the apparatus 10 to transmit stereo audio via a 3.5 mm stereo audio cable, that is to say the jack 44 provides audio-out. This function of the jack 44 allows a user of the apparatus 10 to plug in stereo ear-buds or headphones for private listening and phone calls. This audio-out function also allows a user to connect the apparatus 10 to powered speakers, a home stereo system, or any other known audio device that accepts audio input, and essentially allows the user to make any audio system accept a wireless audio signal from their personal audio device. During the audio-out function of the apparatus 10, the microphone 22 of the apparatus 10 is active, and the apparatus 10 is not configured to accept an audio signal from the attached ear-buds or headphones should they include an in-line microphone. The 3.5 mm jack 44 is not configured to accept any audio input, or audio-in.

Figure 7:
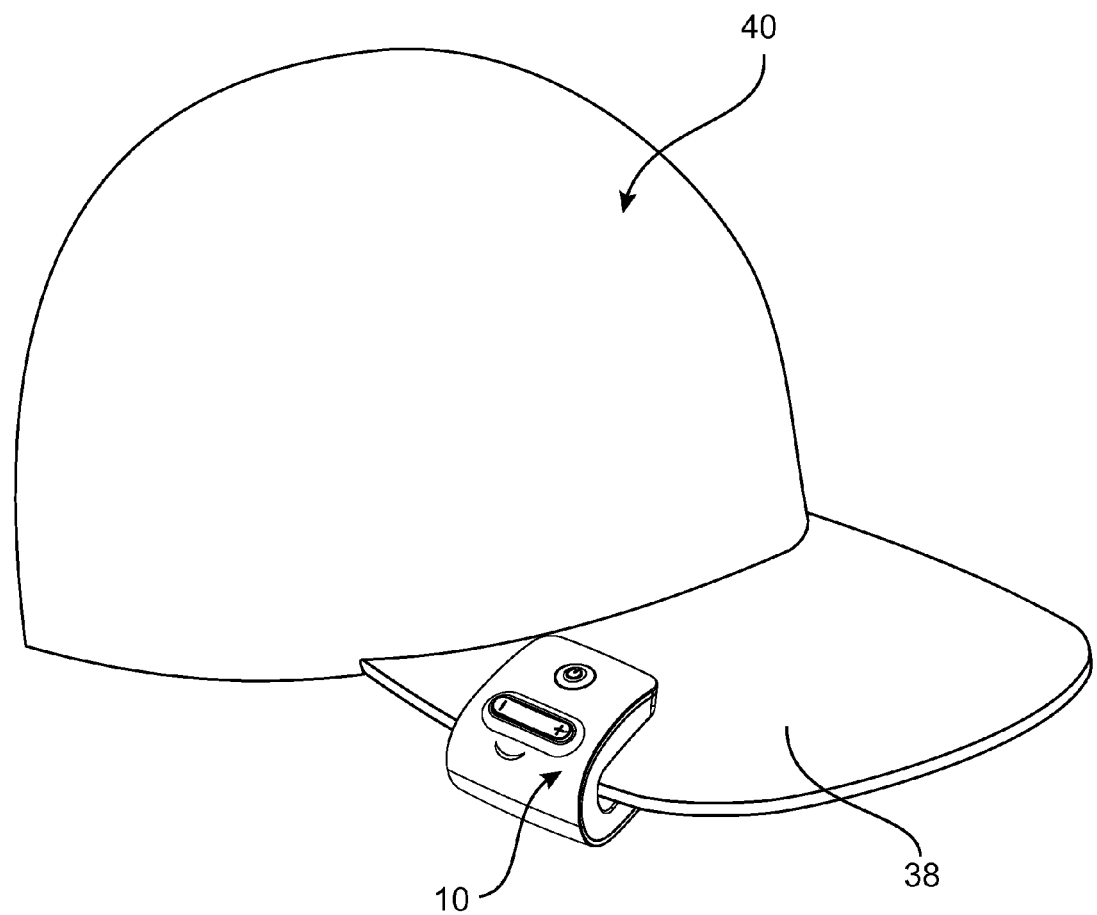
FIG. 7 illustrates the preferred embodiment of the wireless audio control apparatus attached to a brim of a cap.

Turning to FIG. 7, the preferred embodiment of the wireless audio control apparatus 10 attached to a brim 38 of a cap 40 is illustrated. As shown in the figure, the apparatus 10 is clipped to the brim 38 of a standard ball cap 40. In this position, the spring clip 36 holds the apparatus 10 securely to the generally planar brim 38 of the cap 40. Though not shown in the figures, the apparatus 10 preferably comprises a rubber strip on the inner surface 16 of the outer shell 12 opposite to the spring clip 36 to increase the friction between the apparatus 10 and the object to which the apparatus 10 is clipped. Alternatively, a ribbed section on the spring clip 36 or the inner surface 16 of the outer shell 12 may be used as well. In use, the apparatus 10 may be clipped to any appropriate object including but not limited to hats, sun visors, backpack straps, clothing, clip boards, etc. The apparatus 10 may be easily attached or removed, but is secure when attached to an object. In other embodiments (not shown) a spring clip is not present and instead the device wireless audio control apparatus is attached to an object via a non-permanent attachment means such as hook and loop fasteners, Dual Lock™ by 3M or adhesive tape. In still other alternative embodiments in which the apparatus is attached to an object via one of the aforementioned non-permanent attachment means, the device is not U-shaped.

The outer shell 12 of the apparatus 10 is preferably made of plastic, but in an alternative embodiment may be made of any appropriate material, such as but not limited to, metal and composite. The jack cover 26 is preferably made of rubber or silicone, but in alternative embodiments may be made of any material appropriate to seal the jack 44.

In use, the apparatus 10 is lightweight so as not to be intrusive to the user and the speaker 20 provides clear sound to the user. The fact that there is space between the user's ears and the speaker 20 removes the all-immersive sound that a user normally experiences while wearing traditional headphones. This allows for increased safety by allowing the user to still hear other sounds external to the apparatus 10. The fact that the speaker 20 is not directly covering the user's ears allows ambient noise such as traffic and speech to be heard.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

We claim:

1. A wireless audio control apparatus comprising:
   a U-shaped outer shell having an outer surface, an inner surface and a plurality of side surfaces;
   a spring clip attached to the inner surface of the outer shell;
   a speaker located on the outer surface of the outer shell;
   a microphone located on the outer surface of the outer shell;
   at least one control interface located on the outer surface of the outer shell;
   a wireless transceiver located inside the outer shell;
   an amplifier located inside the outer shell;
   a jack located on at least one of the plurality of side surfaces of the outer shell; and
   a rechargeable battery located inside the outer shell;
   whereby the apparatus is configured to control the audio output from a wirelessly attached personal audio device while being removably affixed by the spring clip to a generally planar object worn by a user.

2. The wireless audio control apparatus of claim 1 wherein the generally planar object may be selected from a group comprising of: hats, caps, helmets, backpack straps, sun visors, clothing and clip boards.

3. The wireless audio control apparatus of claim 1 wherein the wireless transceiver controls the personal audio device via the at least one control interface of the apparatus.

4. The wireless audio control apparatus of claim 1 wherein the microphone picks up sound from the user and converts the sound into audio signal for transmission via the wireless transceiver.

5. The wireless audio control apparatus of claim 1 wherein the speaker plays the audio signal received from the personal audio device via the wireless transceiver.

6. The wireless audio control apparatus of claim 1 wherein the wireless transceiver transmits and receives audio signal to and from the personal audio device.

7. The wireless audio control apparatus of claim 1 wherein the at least one control interface comprises a multi-function button and a rocker button.

8. The wireless audio control apparatus of claim 7 wherein the multi-function button performs functions selected from a group comprising of: turning on and turning off the apparatus, pairing with the personal audio device, answering and terminating a phone call, and pausing and resuming an audio track.

9. The wireless audio control apparatus of claim 7 wherein the rocker button performs functions selected from a group comprising of: increasing and decreasing the volume level and advancing to a next/previous audio track.

10. A wireless audio control apparatus for listening to audio and making phone calls from a personal audio device, the apparatus comprising:
    a U-shaped outer shell having an outer surface, an inner surface and a plurality of side surfaces;

a spring clip attached to the inner surface of the outer shell;

a speaker located on the outer surface of the outer shell;

a microphone located the outer surface of the outer shell;

at least one control interface located on the outer surface of the outer shell, the at least one control interface having a multi-function button and a rocker button;

a wireless transceiver located inside the outer shell;

an amplifier located inside the outer shell;

a jack located behind a jack cover on at least one of the plurality of side surfaces of the outer shell; and a rechargeable battery located inside the outer shell;

whereby the apparatus is configured to control the audio output from the wirelessly attached personal audio device while being removably affixed to a generally planar object worn by a user.

11. The wireless audio control apparatus of claim 10 wherein the spring clip holds the apparatus securely to the generally planar object that may be selected from a group comprising of:

hats, caps, backpack straps, sun visors, clothing and clip boards.

12. The wireless audio control apparatus of claim 10 wherein the wireless transceiver receives audio signal from the personal audio device, plays the audio signal through the speaker and transmits the audio signal picked up by the microphone to the personal audio device.

13. The wireless audio control apparatus of claim 10 wherein the multi-function button performs functions selected from a group comprising of: turning on and turning off the apparatus, pairing with the personal audio device, answering and terminating a phone call, and pausing and resuming an audio track.

14. The wireless audio control apparatus of claim 10 wherein the rocker button performs functions selected from a group comprising of: increasing and decreasing the volume level and advancing to a next/previous audio track.

15. The wireless audio control apparatus of claim 10 wherein the jack provides an audio port to transmit audio via a stereo audio cable to an external audio system that may be selected from a group consisting of: ear-buds, headphones, powered speakers and home stereo systems.

* * * * *